United States Patent
Nam

(10) Patent No.: US 10,128,466 B2
(45) Date of Patent: Nov. 13, 2018

(54) LIGHT-EMITTING DEVICE

(71) Applicant: SAMSUNG DISPLAY CO., LTD., Yongin, Gyeonggi-Do (KR)

(72) Inventor: Eunkyoung Nam, Hwaseong-si (KR)

(73) Assignee: SAMSUNG DISPLAY CO., LTD., Yongin, Gyeonggi-do (KR)

(*) Notice: Subject to any disclaimer, the term of this patent is extended or adjusted under 35 U.S.C. 154(b) by 0 days.

(21) Appl. No.: 14/792,773

(22) Filed: Jul. 7, 2015

(65) Prior Publication Data

US 2016/0118613 A1 Apr. 28, 2016

(30) Foreign Application Priority Data

Oct. 22, 2014 (KR) .................. 10-2014-0143458

(51) Int. Cl.
*H01L 51/50* (2006.01)
*H01L 51/52* (2006.01)

(52) U.S. Cl.
CPC .................. *H01L 51/5278* (2013.01)

(58) Field of Classification Search
None
See application file for complete search history.

(56) References Cited

U.S. PATENT DOCUMENTS

| | | | |
|---|---|---|---|
| 8,476,624 B1 | 7/2013 | Wu et al. | |
| 2014/0061601 A1* | 3/2014 | Kim | C07D 401/10 257/40 |
| 2014/0084269 A1 | 3/2014 | Weaver et al. | |
| 2014/0183475 A1* | 7/2014 | Song | H01L 51/5044 257/40 |
| 2015/0034923 A1* | 2/2015 | Kim | H01L 51/5044 257/40 |
| 2016/0005991 A1* | 1/2016 | Lee | H01L 51/5044 257/40 |

FOREIGN PATENT DOCUMENTS

| | | |
|---|---|---|
| KR | 10-2008-0105640 A | 12/2008 |
| KR | 10-2011-0089128 A | 8/2011 |
| KR | 10-2013-0113055 A | 10/2013 |

* cited by examiner

*Primary Examiner* — Jack Chen
(74) *Attorney, Agent, or Firm* — Lee & Morse P.C.

(57) ABSTRACT

A light-emitting device includes a first electrode and a second electrode opposed to each other, a first stack between the first and second electrodes, the first stack being adjacent to the first electrode and including a first light-emitting layer, a second stack between the first and second electrodes, the second stack being adjacent to the second electrode and including a second light-emitting layer, and a charge generation structure between the first and second stacks, the charge generation structure including an n-type charge generation layer, an interlayer organic layer, and a p-type charge generation layer which are sequentially stacked on the first stack.

11 Claims, 4 Drawing Sheets

LIGHT-EMITTING DEVICE

CROSS-REFERENCE TO RELATED APPLICATION

Korean Patent Application No. 10-2014-0143458, filed on Oct. 22, 2014, in the Korean Intellectual Property Office, and entitled: "Light-Emitting Device," is incorporated by reference herein in its entirety.

BACKGROUND

1. Field

The present disclosure herein relates to a light-emitting device, and more particularly, to a light-emitting device having a tandem structure.

2. Description of the Related Art

A light-emitting device includes a light-emitting layer that is inserted between a pair of electrodes opposed to each other. When an electric field is applied between the pair of electrodes, electrons and holes are respectively injected from an anode and a cathode into the light-emitting layer. When the electrons and the holes are recombined in the light-emitting layer, the recombination energy level returns from a conduction band to a valence band, and thus energy is released as light.

SUMMARY

The present disclosure provides an electrically and optically efficient light-emitting device.

Embodiments provide light-emitting devices, including a first electrode and a second electrode opposed to each other, a first stack between the first and second electrodes, the first stack being adjacent to the first electrode and including a first light-emitting layer, a second stack between the first and second electrodes, the second stack being adjacent to the second electrode and including a second light-emitting layer, and a charge generation structure between the first and second stacks, the charge generation structure including an n-type charge generation layer, an interlayer organic layer, and a p-type charge generation layer which are sequentially stacked on the first stack.

In some embodiments, a thickness ratio between the n-type charge generation layer, the interlayer organic layer and the p-type charge generation layer is about 5:4:7.

In other embodiments, the interlayer organic layer may include an organic material having an insulation property.

In still other embodiments, the first stack may further include: a first hole injection layer on the first electrode, a first hole transport layer between the first hole injection layer and the first light-emitting layer, a first electron transport layer on the light-emitting layer, and a first electron injection layer between the first electron transport layer and the first n-type charge generation layer.

In even other embodiments, the second stack may further include a second hole injection layer on the p-type charge generation layer, a second hole transport layer between the second hole injection layer and the second light-emitting layer, a second electron transport layer on the second light-emitting layer, and a second electron injection layer between the second electron transport layer and the second electron transport layer.

In other embodiments, light-emitting devices include a first electrode and a second electrode opposed to each other, a first stack between the first and second electrodes so as to be adjacent to the first electrode and including a first light-emitting layer, a second stack between the first and second electrodes so as to be adjacent to the second electrode and including a second light-emitting layer, and a charge generation structure between the first and second stacks including an n-type charge generation layer, an interlayer organic layer and a p-type charge generation layer which are sequentially stacked on the first stack.

In some embodiments, a thickness ratio between the metal layer and the p-type charge generation layer may be about 1:50.

In other embodiments, the first stack may further include: a first hole injection layer on the first electrode, a first hole transport layer between the first hole injection layer and the first light-emitting layer, and a first electron transport layer between the first light-emitting layer and the n-type charge generation layer.

In still other embodiments, the metal layer may perform a function that injects electrons into the electron transport layer of the first stack and a function that generates electrons of the charge generation structure.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
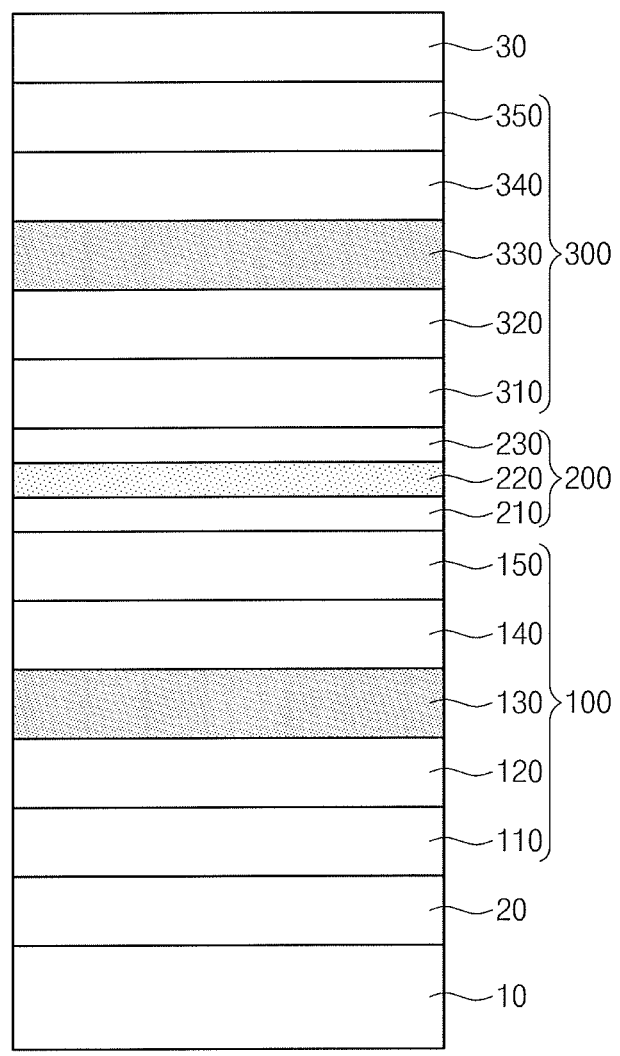
FIG. 1 illustrates a cross-sectional view of a light-emitting device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Additionally, the embodiments in the detailed description will be described with sectional views and/or plain views as ideal exemplary views of the embodiments. In the figures, the dimensions of layers and regions may be exaggerated for clarity of illustration. Accordingly, shapes of the exemplary views may be modified according to manufacturing techniques and/or allowable errors. Therefore, the embodiments are not limited to the specific shapes illustrated in the exemplary views, but may include other shapes that may be created according to manufacturing processes.

It will be understood that although the terms first, second and third are used herein to describe various elements, these elements should not be limited by these terms. These terms are used only to distinguish one region or layer from another region or layer. An embodiment described and exemplified herein includes a complementary embodiment thereof.

In the following description, the technical terms are used only for explaining a specific exemplary embodiment without limiting. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

Hereinafter, embodiments will be described in detail with reference to the accompanying drawings.

FIG. 1 illustrates a cross-sectional view of a light-emitting device according to an embodiment.

Referring to FIG. 1, a light-emitting device includes a substrate 10, a first electrode 20, and a second electrode 30 which are disposed on the substrate 10, a charge generation structure 200 disposed between the first and second electrodes 20 and 30, a first stack 100 disposed between the first electrode 20 and the charge generation structure 200 and including a first light-emitting layer 130, and a second stack 300 between the charge generation structure 200 and the second electrode 30 and including a second light-emitting layer 330.

The substrate 10 may be formed of, e.g., glass, transparent plastic, quartz or the like. However, embodiments are not limited to the materials of the substrate 10 described above.

The first electrode 20 may perform a function of an anode supplying holes to a hole transport layer of the first stack 100 on the first electrode 20.

When the first electrode 20 is a transparent electrode, the first electrode 20 may include a material having a relatively high work function, e.g., indium tin oxide (ITO), indium zinc oxide (IZO), zinc tin oxide (ZTO), gallium zinc oxide (GZO), gallium indium zinc oxide (GIZO), aluminum-doped zinc oxide (AZO), zinc oxide (ZnO), indium tin zinc oxide (ITZO), indium oxide ($InO_x$), zinc oxide (ZnO), gallium oxide ($GaO_x$), or tin oxide ($SnO_x$). The materials may be used alone, or may be used in combination with two or more types.

When the first electrode 20 is a reflector, the first electrode 20 may include metal, e.g., silver (Ag), magnesium (Mg), neodymium (Nd), iridium (Ir), aluminum (Al), platinum (Pt), gold (Au), chromium (Cr), tungsten (W), molybdenum (Mo), titanium (Ti) and palladium (Pd), or an alloy thereof.

According to an embodiment, the first electrode 20 may have a multi-layered structure constituted of a first layer that includes the metal or the alloy described above, and a second layer that includes the transparent conductive materials described above. In this case, the first electrode 20 may be a transflective electrode.

The first stack 100 is disposed on the first electrode 20, and may include a first hole transport layer 120, the first light-emitting layer 130, and a first electron transport layer 140.

The first hole transport layer 120 may be formed of a hole transport material that has a hole transport function, and may be a single layer or a multi-layer. The hole transport material has at least one of a hole injection or transport property, and an electron barrier property, and may be any one of an organic material and an inorganic material. The hole transport material may include, for example, a carbazole derivative, e.g., N-phenyl carbazole, polyvinyl carbazole or the like, a triphenylamine-based derivative, e.g., N,N'-bis(3-methylphenyl)-N,N'-diphenyl-[1,1-biphenyl]-4,4'-diamine (TPD) or the like, N,N'-di(1-naphthyl)-N,N'-diphenylbenzidine (NPB), 4,4',4"-tris(N-carbazolyl)triphenylamine (TCTA), 4,4'-cyclohexylidenebis[N,N-bis(4-methylphenyl)benzenamine] (TAPC) or the like, but is not limited thereto. The materials may be used alone, or may be used in a mixture thereof. The first hole transport layer 120 may be formed through deposition or a wet process, e.g., a vacuum deposition process, a heat deposition process, a slit coating process, a spin coating process, a printing process or the like.

The first light-emitting layer 130 may be disposed on the first hole transport layer 120. The first light-emitting layer 130 is a layer that emits light after holes injected from the first electrode 20 and electrons injected from the charge generation structure 200 are recombined therein to generate excitons.

The first light-emitting layer 130 may emit red light, blue light, green light or white light together with the second light-emitting layer 330. The first light-emitting layer 130 may be formed of a material that emits red light, green light, and blue light, and include a fluorescent material or a phosphorescent material. When the first light-emitting layer 130 includes a phosphorescent material, the light-emitting layer 130 may include a host and a dopant. The host may be, but is not particularly limited to, e.g., tris(8-quinolinolato)aluminum ($Alq_3$), 4,4'-bis(N-carbazolyl)-1,1'-biphenyl (CBP), poly(n-vinylcabazole) (PVK), 9,10-di(naphthalen-2-yl)anthracene (ADN), 4,4',4"-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), or the like.

When the first light-emitting layer 130 emits red light, the first light-emitting layer 130 may include, e.g., a florescent material that includes PBD:Eu(DBM)3(Phen) or Perylene. When the first light-emitting layer 130 emits red light, the dopant, which is included in the first light-emitting layer 130, may include, e.g., at least one of PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium) and PtOEP(octaethylporphyrin platinum).

When the first light-emitting layer 130 emits green light, the first light-emitting layer 130 may include, e.g., a florescent material that includes tris(8-hydroxyquinolino)aluminum ($Alq_3$). In another example, when the first light-emitting layer 130 emits green light, the first light-emitting layer 130 may include, e.g., a florescent material that includes fac tris(2-phenylpyridine)iridium (Ir(ppy)3).

When the first light-emitting layer 130 emits blue light, the first light-emitting layer 130 may include, e.g., a florescent material that includes any one of spiro-DPVBi, spiro-6P, distill benzene (DSB), distyrylarylene (DSA), a PFO-based polymer and a PPV-based polymer. When the first light-emitting layer 130 emits blue light, the dopant, which is included in the first light-emitting layer 130, may include, e.g., (4,6-F2ppy)2Irpic.

The electron transport layer 140 may be disposed on the first light-emitting layer 130. The first electron transport layer 140 may be formed of a material that has an electron transport function, and may be a single layer or a multi-layer. The first electron transport layer 140 may have a function that transports electrons injected from the charge injection layer to the first light-emitting layer 130. The electron transport layer 140 may include, e.g., at least one of tris(8-hydroxyquinolinato)aluminum ($Alq_3$), 1,3,5-Tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-Biphenyl-4-olato) aluminum (BAlq), berylliumbis(benzoquinolin-10-olate) (Bebq2), 9,10-di(naphthalene-2-yl)anthracene (AND), but is not limited thereto. The materials may be used alone, or may be used in a mixture thereof.

According to an aspect of embodiments, the first stack 100 may further include a first hole injection layer 110 between the first electrode 20 and the first hole transport layer 120. The first hole injection layer 110 may play a role in smoothly injecting holes into the first hole transport layer 120 from the first electrode 20. The first hole injection layer 110 may include, for example, a hole injection material, such as carbazole derivatives, e.g., N-phenyl carbazole, polyvinyl carbazole or the like, triphenylamine-based derivatives, e.g., N,N'-bis(3-methylphenyl)-N,N'-diphenyl-[1,1-biphenyl]-4,4'-diamine (TPD) or the like, N,N'-di(1-naphthyl)-N,N-diphenylbenzidine (NPB), 4,4',4''-tris(N-carbazolyl)triphenylamine (TCTA), 4,4'-cyclohexylidenebis[N,N-bis(4-methylphenyl)benzenamine] (TAPC) or the like, but is not limited thereto. The first hole injection layer 110 may be formed through deposition or a wet process, e.g., a vacuum deposition process, a heat deposition process, a slit coating process, a spin coating process, a printing process or the like.

According to an aspect of embodiments, the first stack 100 may further include a first electron injection layer 150 between the first electron transport layer 140 and the charge generation structure 200. The first electron injection layer 150 may play a role in smoothly injecting electrons into the first electron transport layer 140 from the charge generation structure 200. The first electron injection layer 150 may be formed of a metal-containing material. The metal-containing material may be, e.g., LiF, lithium quinolate (LiQ), $Li_2O$, BaO, NaCl, CsF or the like.

Also, the first electron injection layer 150 may be formed of a material in which an electron transport material and an organo metal salt are mixed. The organo metal salt may be a material having an energy band gap of about 4 eV or more. In detail, for example, the organo metal salt may include metal acetate, metal benzoate, metal acetoacetate, metal acetylacetonate or metal stearate, but is not limited thereto. The first electron injection layer 150 may be formed through deposition or a wet process such as a vacuum deposition process, a heat deposition process, a slit coating process, a spin coating process, a printing process or the like.

The charge generation structure 200 plays a role in adjusting charge balance between the first stack 100 and the second stack 300, and may be also referred to as an intermediate connector layer. According to an embodiment, the charge generation structure 200 may include an n-type charge generation layer 210, an interlayer organic layer 220, and a p-type charge generation layer 230.

According to an aspect, a thickness ratio between the n-type charge generation layer 210, the interlayer organic layer 220, and the p-type charge generation layer 230 may be about 5:4:7. For example, the n-type charge generation layer 210, the interlayer organic layer 220, and the p-type charge generation layer 230 may have thicknesses of about 45 Å to about 55 Å, about 35 Å to about 45 Å, and about 65 Å to about 75 Å, respectively.

The n-type charge generation layer 210 may help electrons to be injected into the first stack 100. The n-type charge generation layer 210 may have a structure in which an n-type dopant is doped into an electron transport material. The electron transport material may be a material for the first electron transport layer 140. In an example, the n-type dopant of the n-type charge generation layer 210 may be one of elements (alkali metals) of Group 1 or elements (alkaline earth metals) of Group 2 of the Periodic Table. For example, the n-type dopant may include at least one of, e.g., lithium (Li), sodium (Na), magnesium (Mg), calcium (Ca) and cesium (Cs). In another example, the charge generation layer 210 may use, as the n-type dopant, $Cr_2hpp_4$ (hpp: 1,3,4,6,7,8-hexahydro-2H-pyrimido[1,2-a]pyrimidonate), $Fe_2hpp_4$, $Mn_2hpp$, $Co_2hpp_4$, $Mo_2hpp_4$, $W_2hpp_4$, $Ni_2hpp4$, $Cu_2hpp4$, $Zn_2hpp_4$, and $W(hpp)_4$. In addition, organic dopant compounds such as 4,4',5,5'-tetracyclohexyl-1,1',2,2',3,3'-hexamethyl-2,2',3,3-tetrahydro-1H-1'H-2,2'-biimidazole, 2,2'-diisopropyl-1,1',3,3'-tetramethyl-2,2',3,3',4,4',5,5',6,6',7,7'-dodecahydro-1H,1'H-2,2'-bibenzo[d]imidazole, 2,2'-diisopropyl-4,4',5,5'-tetrakis(4-methoxyphenyl)-1,1',3,3'-tetramethyl-2,2',3,3'-tetrahydro-1H,1'H-2,2'-biimidazole, 2,2'-diisopropyl-4,5-bis(2-methoxyphenyl)-4',5'-bis(4-methoxyphenyl)-1,1',3,3'-tetramethyl-2,2',3,3'-tetrahydro-1H,1'H-2,2'-biimidazole), or 2,2'-diisopropyl-4,5-bis(2-methoxyphenyl)-4',5'-bis(3-methoxyphenyl)-1,1',3,3'-tetramethyl-2,2',3,3'-tetrahydro-1H,1'H-2,2'-biimidazole may be used.

The p-type charge generation layer 230 may help electrons to be injected into the second stack 300. For example, the p-type charge generation layer 230 may be a single layer including an organic material. The p-type charge generation layer 230 may include a material of the first hole transport layer 120. For example, a host material of the p-type charge generation layer 230 may include a material that is substantially identical to a material for the first hole transport layer 120, which has an electron or exciton blocking property. The p-type dopant of the p-type charge generation layer 230 may include an aromatic ring having at least one cyanide (CN) group, at least one fluoride (F) group, and an allyl compound. For example, the p-type dopant may essentially include C, N and F, and may selectively include H. The p-type charge generation layer 230 may use, as the p-type dopant, 2,2'-(perfluoronaphthalene-2,6-diylidene)dimalononitrile, 2,2'-(2,5-dibromo-3,6-difluorocyclohexa-2,5-diene-1,4-diylidene)dimalononitrile, (2E,2'E,2''E)-2,2',2''-(cyclopropane-1,2,3-triylidene)tris(2-(2,6-dichloro-3,5-difluoro-4-(trifluoromethyl)phenyl)acetonitrile), or 4,4',4''-cyclopropane-1,2,3-triylidenetris(cyanomethane-1-yl-1-ylidene)tris(2,3,5,6-tetrafluorobenzonitrile)

The interlayer organic layer 220 between the n-type and p-type charge generation layers (210 and 230) may enhance transport of charges generated from the n-type and p-type charge generation layers (210 and 230). Accordingly, carriers such as electrons and holes in the n-type and p-type charge generation layers (210 and 230) are moved in the opposite directions to each other to intensify an electric field, so a driving voltage of the light-emitting device may be reduced.

The interlayer organic layer 220 does not include a dopant. The interlayer organic layer 220 may include the host material of the first electron transport layer 140 or the host material of the first hole transport layer 120. The interlayer organic layer 220 may include an organic material having an insulation property. The interlayer organic layer 220 may include a carrier material such as a hole transport material or an electron transport material. In an example, the interlayer organic layer 120 may include a material that is included in the first hole transport layer 220.

The second stack 300 is disposed on the charge generation layer 200, and may include a second hole transport layer 320, the second light-emitting layer 330, and a second electron transport layer 340. The second hole transport layer 320, the second light-emitting layer 330, and the second electron transport layer 340 are the same as the first hole transport layer 120, the first light-emitting layer 130, and the first electron transport layer 140 in terms of function and a material, respectively, so details thereof will be omitted.

Also, according to an aspect, the second stack 300 may further include a second hole injection layer 310 between the second charge generation structure 200 and the second hole transport layer 320, and a second electron injection layer 350 between the second electron transport layer 340 and the second electrode 30. The second hole injection layer 310 and the second electron injection layer 350 are the same as the first hole injection layer 110 and the first electron injection layer 150 in terms of function and material, respectively, so details thereof will be omitted.

In an embodiment, a tandem light-emitting device in which two stacks are stacked, is exemplarily described, but embodiments are not limited to two stacks. Only when at least two stacks are stacked, the charge generation structure 200 according to embodiments is disposed between two adjacent stacks.

The second electrode 30 may act as a cathode supplying electrons to the second electron transport layer 340 of the second stack 300. The second electrode 30 may include a metal having a relatively low work function. For example, the second electrode 30 may include lithium, magnesium, aluminum, silver and an alloy thereof. The second electrode 30 may have a single-layered structure or a multi-layered structure which includes the metals and/or the alloy.

Figure 2:
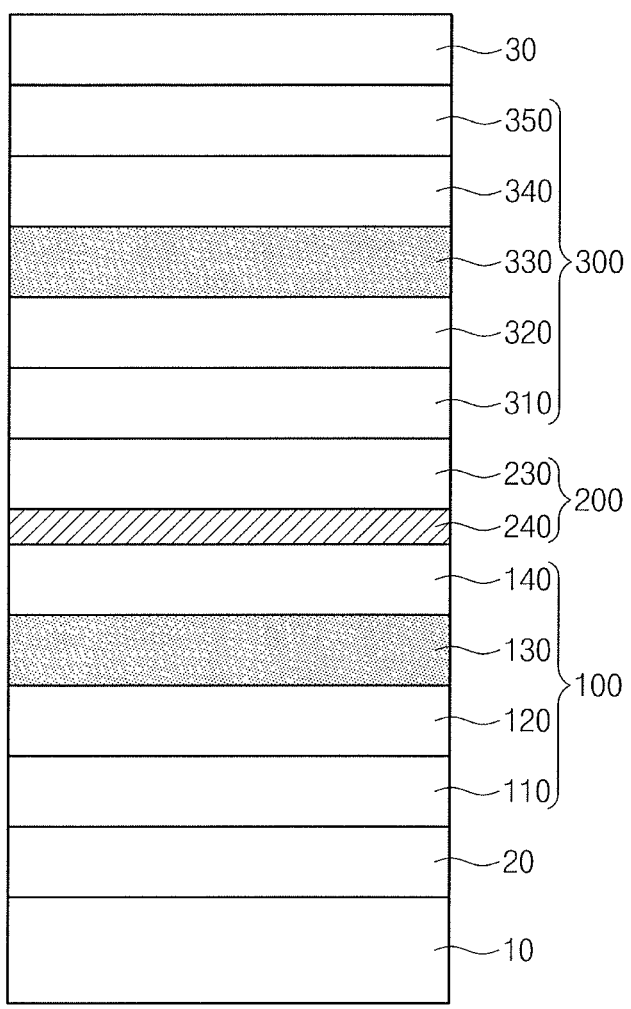
FIG. 2 illustrates a cross-sectional view of a light-emitting device according to an embodiment.

FIG. 2 illustrates a cross-sectional view of a light-emitting device according to an embodiment.

Referring to FIG. 2, a light-emitting device includes the substrate 10, the first electrode 20, and the second electrode 30 disposed on the substrate 20, a charge generation structure 200' disposed between the first and second electrodes 20 and 30, a first stack 100' including the first light-emitting layer 130 between the first electrode 20 and the charge generation structure 200, and the second stack 300 including the second light-emitting layer 330 between the charge generation structure 200' and the second electrode 30.

The first stack 100' may have a structure in which the first hole injection layer 110, the first hole transport layer 120, the first light-emitting layer 130, and the first electron transport layer 150 are sequentially stacked on the first electrode 20. The second stack 300 may have a structure in which the second hole injection layer 310, the second hole transport layer 320, the second light-emitting layer 330, the second electron transport layer 340, and the second electron injection layer 350 are sequentially stacked on the charge generation structure 200. The charge generation structure 200' includes a metal layer 240 disposed adjacent to the first stack 100 and the p-type charge generation layer 230 disposed adjacent to the second stack 300.

The metal layer 240 may include one of silver (Ag) and aluminum (Al). According to an embodiment, the metal layer 240 is formed of metal, and does not use a metal in an organic material as a dopant. According to an embodiment, a thickness ratio between the metal layer 240 and the p-type charge generation layer 230 may be about 1:50. For example, when the first hole transport layer 120 has a thickness of about 100 Å, and the p-type charge generation layer 230 has a thickness of about 500 Å, the metal layer 240 may be very thin at a thickness of about 8 Å to about 12 Å.

In an embodiment, the metal layer 240 may replace the functions of the n-type charge generation layer 210 of the charge generation structure 200 and, and may play a role in lowering a charge injection barrier between the n-type charge generation layer 210 and the first hole transport layer 120 of the first stack to reduce a driving voltage of the light-emitting device. The mechanism will be described in detail in the following Examples.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Comparative Example

ITO was coated on a glass substrate to form a first electrode, and then 2TNATA was vacuum-deposited at a thickness of about 600 Å to form a first hole injection layer on the first electrode. Next, NPB was vacuum-deposited on the first hole injection layer at a thickness of about 300 Å to form a first hole transport layer. Next, MADN and 5 wt % of compound BD-1 were vacuum-deposited at a thickness of about 300 Å to form a first light-emitting layer. After that, a first electron transport layer and LiF (10 Å, a first electron injection layer) were sequentially formed on the first light-emitting layer to complete a first stack.

An n-type electron generation layer (50 Å) doped with Li and a p-type charge generation layer (70 Å) were sequentially deposited on the first stack to form an electron generation structure.

The same process as the first stack was performed on the charge generation structure to complete a second stack. After that, a second electrode including the second stack CsF and Al, were formed to complete a tandem light-emitting device.

Example 1

A first electrode, a first stack, a second stack, and a second electrode were formed of the same material as those in the Comparative Example. Only a charge generation structure, which is disposed between the first and second stacks, was formed differently from Comparative Example. In detail, the charge generation structure was formed by sequentially stacking an n-type charge generation layer (50 Å) doped with Li, an interlayer organic layer (40 Å) including a hole transport material, and a p-type charge generation layer (70 Å).

Example 2

ITO was coated on a glass substrate to form a first electrode, and then a first hole injection layer, a first hole transport layer, a first light-emitting layer, and a first electron transport layer were sequentially stacked through a vacuum-deposition to form a first stack. That is, a first electron injection layer was not formed in Example 1.

A metal layer (10 Å) including silver (Ag) and a p-type electron generation layer (500 Å) were sequentially stacked on the first stack to form a charge generation structure.

The second stack and the second electrode of Example 1 were sequentially stacked on the charge generation structure.

Example 3

A first electrode, a first stack, a second stack, and a second electrode were formed of the same material as those in Example 2. Only a charge generation structure, which is disposed between the first and second stacks, was formed differently from Example 2. In detail, the charge generation structure was formed by sequentially stacking a metal layer (10 Å) including silver (Ag) and a p-type electron generation layer (500 Å).

Hereinafter, physical properties of Comparative Example and Examples 1 to 3 will be described.

Driving Voltage According to Brightness

Figure 3:
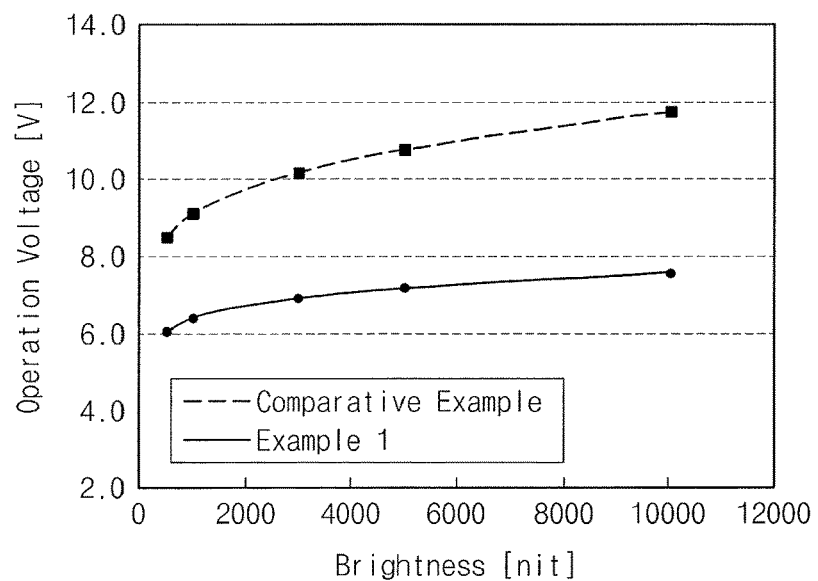
FIG. 3 illustrates a graph showing driving voltages of a Comparative Example and Example 1 according to brightness.

FIG. 3 illustrates a graph showing a driving voltage of Comparative Example and Example 1 according to brightness.

Referring to FIG. 3, it may be seen that the light-emitting device of Example 1 has a lower driving voltage with respect to brightness than that of the light-emitting device of the Comparative Example. For example, the driving voltage of Example 1 as compared to the Comparative Example is reduced from about 9.10 V to about 6.37 V, i.e., by about 3 V, at a brightness of about 1,000 nit.

Power Efficiency According to Brightness

Figure 4:
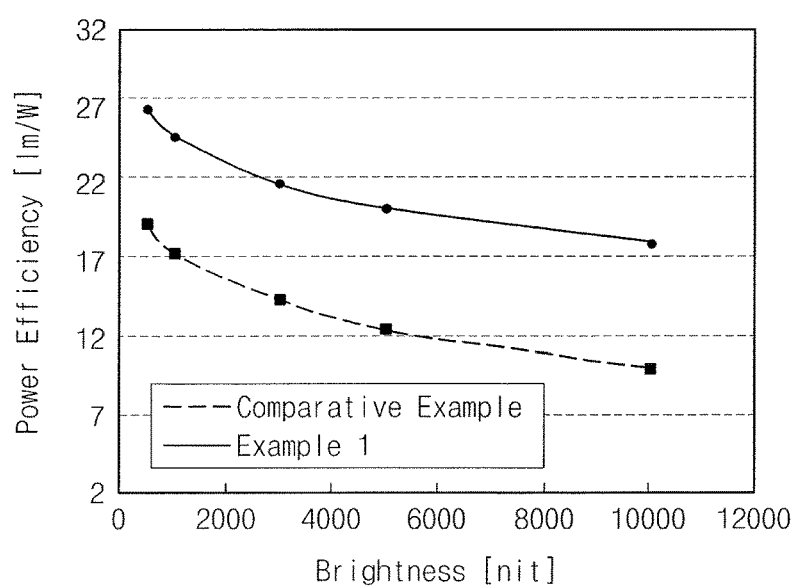
FIG. 4 illustrates a graph showing power efficiency brightness of a Comparative Example and Example 1 according to brightness.

FIG. 4 illustrates a graph showing power efficiency according to brightness of the Comparative Example and Example 1.

Referring to FIG. 4, it may be seen that the light-emitting device in Example 1 has power efficiency with respect to brightness that is improved as compared to the light-emitting device of the Comparative Example. For example, at the same brightness, the light-emitting device of the Comparative Example shows brightness of about 17.111 lm/W, and the light-emitting device of Example 1 shows brightness of about 24.57 lm/W. As such, the light-emitting device of Example 1 shows that its brightness is improved by about 7.5 lm/W.

Current Density According to Driving Voltage

Figure 5:
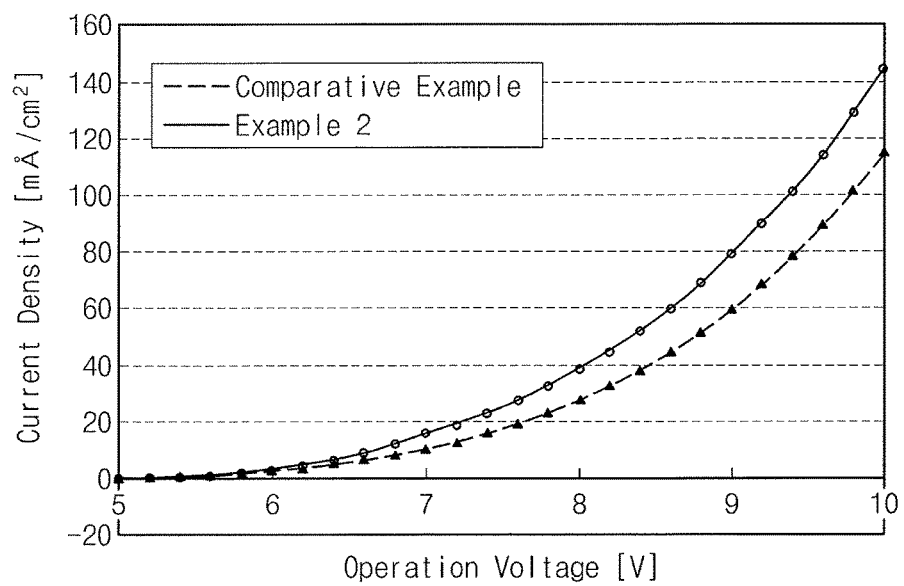
FIG. 5 illustrates a graph showing current density according to a driving voltage of a Comparative Example and Example 2.
Figure 6:
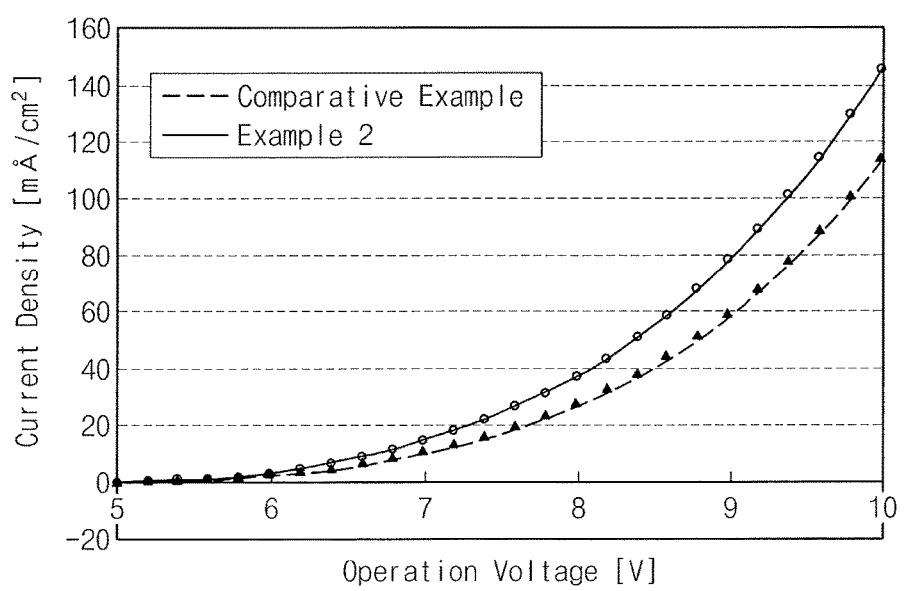
FIG. 6 illustrates a current density according to a driving voltage of a Comparative Example and Example 3.

FIG. 5 illustrates a graph showing current density according to driving voltage of the Comparative Example and Example 2, and FIG. 6 is a graph of current density according to the driving voltage of the Comparative Example and Example 3.

Referring to FIG. 5, the light-emitting device of Example 2 shows a higher current density at the same driving voltage, as compared to the light-emitting device of Comparative Example. For example, at a driving voltage of 10 V, the light-emitting device of Example 2 shows a current density higher than 140 mA/cm$^2$, while the light-emitting device of the Comparative Example shows a current density lower than 120 mA/cm$^2$.

Referring to FIG. 6, the light-emitting device of Example 3 shows a higher current density at the same driving voltage, as compared to the light-emitting device of Comparative Example. For example, at a driving voltage of 10 V, the light-emitting device of Example 3 shows a current density around 150 mA/cm$^2$, while the light-emitting device of the Comparative Example shows a current density around 120 mA/cm$^2$.

Therefore, the light-emitting devices of Examples 2 and 3 require a lower driving voltage for realizing the same current density, as compared to the light-emitting device of the Comparative Example. Thus, the light-emitting devices of Examples 2 and 3 are electrically more efficient than the light-emitting device of the Comparative Example.

By way of summation and review, a light-emitting device with a single stack structure may have low efficiency. In order to improve of the efficiency of the light-emitting device, a light-emitting device may include a tandem structure including a plurality of stacks. The light-emitting device having the tandem structure is expected to improve efficiency more than twice that of a light-emitting device having a single structure, and in order to realize the light-emitting device having the tandem structure, a charge generation layer should be provided to connect the two stacks. The electrical and optical properties of the charge generation layer are factors that determine the efficiency of the light-emitting device having the tandem structure.

Therefore, according to embodiments, an interlayer organic material is inserted between an n-type charge generation layer and a p-type charge generation layer in a charge generation layer to improve charge transport performance, thereby reducing a driving voltage of a light-emitting device. Also, the n-type charge generation layer of the charge generation structure is replaced with a metal thin film to omit an electron injection layer, thereby reducing the driving voltage of the light-emitting device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A light-emitting device, comprising:
a first electrode and a second electrode opposed to each other;
a first stack between the first and second electrodes, the first stack being adjacent to the first electrode and including a first light-emitting layer;
a second stack between the first and second electrodes, the second stack being adjacent to the second electrode and including a second light-emitting layer; and
a charge generation structure between the first and second stacks, the charge generation structure including an n-type charge generation layer, an interlayer organic layer, and a p-type charge generation layer which are sequentially stacked on the first stack, the interlayer organic layer being different from the n-type charge generation layer and the p-type charge generation layer,
wherein
a thickness of the n-type charge generation layer is greater than a thickness of the the interlayer organic layer, and is smaller than a thickness of the p-type charge generation layer.

2. The light-emitting device as claimed in claim 1, wherein a thickness ratio between the n-type charge generation layer, the interlayer organic layer, and the p-type charge generation layer is about 5:4:7.

3. The light-emitting device as claimed in claim 1, wherein the interlayer organic layer includes an organic material having an insulation property.

4. The light-emitting device as claimed in claim 1, wherein the first stack further comprises:
   a first hole injection layer on the first electrode;
   a first hole transport layer between the first hole injection layer and the first light-emitting layer;
   a first electron transport layer on the first light-emitting layer; and
   a first electron injection layer between the first electron transport layer and the n-type charge generation layer, wherein
   the first electron injection layer directly contacts the first electron transport layer and the n-type charge generation layer.

5. The light-emitting device as claimed in claim 1, wherein the second stack further comprises:
   a second hole injection layer on the p-type charge generation layer;
   a second hole transport layer between the second hole injection layer and the second light-emitting layer;
   a second electron transport layer on the second light-emitting layer; and
   a second electron injection layer between the second electron transport layer and the second electrode.

6. A light-emitting device, comprising:
   a first electrode and a second electrode opposed to each other;
   a first stack between the first and second electrodes, the first stack being adjacent to the first electrode and including a first light-emitting layer;
   a second stack between the first and second electrodes, the second stack being adjacent to the second electrode and including a second light-emitting layer; and
   a charge generation structure between the first and second stacks, the charge generation structure including a metal layer and an p-type charge generation layer which are sequentially stacked on the first stack, wherein
   the metal layer includes one of silver and aluminum.

7. The light-emitting device as claimed in claim 6, wherein the first stack further comprises:
   a first hole injection layer on the first electrode;
   a first hole transport layer between the first hole injection layer and the first light-emitting layer; and
   a first electron transport layer between the first light-emitting layer and the metal layer.

8. The light-emitting device as claimed in claim 7, wherein the metal layer is in direct contact with the first electron transport layer.

9. The light-emitting device as claimed in claim 6, wherein a thickness of the metal layer is smaller than a thickness of the p-type charge generation layer.

10. The light-emitting device as claimed in claim 6, wherein a range of a thickness ratio of the metal layer to the p-type charge generation layer is from about 1:41 to about 1:62.

11. The light-emitting device as claimed in claim 10, wherein a thickness of the metal layer is about 8 Å to about 12 Å.

* * * * *